(12) United States Patent
Fang et al.

(10) Patent No.: US 7,639,719 B2
(45) Date of Patent: Dec. 29, 2009

(54) THERMAL SHUNT FOR ACTIVE DEVICES ON SILICON-ON-INSULATOR WAFERS

(75) Inventors: Alexander Fang, Goleta, CA (US); Richard Jones, San Mateo, CA (US); Hyundai Park, Goleta, CA (US); Matthew Sysak, Santa Barbara, CA (US)

(73) Assignee: Intel Corporation, Santa Clara, CA (US)

( * ) Notice: Subject to any disclaimer, the term of this patent is extended or adjusted under 35 U.S.C. 154(b) by 87 days.

(21) Appl. No.: 11/968,000

(22) Filed: Dec. 31, 2007

(65) Prior Publication Data

US 2009/0168821 A1 Jul. 2, 2009

(51) Int. Cl.
*H01S 3/00* (2006.01)
*H01S 3/04* (2006.01)
*H01L 21/00* (2006.01)
*H01L 23/34* (2006.01)

(52) U.S. Cl. .......................... 372/34; 372/33; 257/712; 257/E33.075; 438/26

(58) Field of Classification Search ................... 372/33, 372/34; 257/712, E33.075; 438/26
See application file for complete search history.

(56) References Cited

U.S. PATENT DOCUMENTS 6,288,426 B1 * 9/2001 Gauthier et al. ............. 257/347

* cited by examiner

*Primary Examiner*—Armando Rodriguez
(74) *Attorney, Agent, or Firm*—Kevin A. Reif

(57) ABSTRACT

An optimized structure for heat dissipation is provided that may include two types of thermal shunts. The first type of thermal shunt employed involves using p and n metal contact layers to conduct heat away from the active region and into the silicon substrate. The second type of thermal shunt involves etching and backfilling a portion of the silicon wafer with poly-silicon to conduct heat to the silicon substrate.

19 Claims, 3 Drawing Sheets

THERMAL SHUNT FOR ACTIVE DEVICES ON SILICON-ON-INSULATOR WAFERS

FIELD OF THE INVENTION

Embodiments of the present invention are directed to heat management for silicon-on-insulator wafers and, more particularly, to thermal shunts compatible with hybrid silicon lasers.

BACKGROUND INFORMATION

Hybrid silicon laser have been developed that can produce terabit-level optical computer data pipes for high-performance computing applications. Using standard silicon manufacturing processes, the light-emitting properties of Indium Phosphide (InP) may be combined with the light-routing capabilities of silicon into a single hybrid chip. When voltage is applied, light generated in the InP enters the silicon waveguide to create a continuous laser beam that can be used to drive other silicon photonic devices.

Generally, silicon-on-insulator (SOI) devices produce heat when operating which should be managed. FIG. 1 shows a simple diagram of a typical SIO wafer. Silicon-on-insulator wafers may include a basic three layer structure. The top silicon epitaxial layer acts as a waveguide 100, with the $SiO_2$ buried oxide layer 102 acting as a lower cladding confining the optical mode and stopping it leaking into the lower silicon substrate 104. Typical thicknesses for this buried oxide layer 102 is 0.35 µm for waveguides taller than 2.5 µm and 1 µm for waveguides shorter than 1.5 µm in height.

For optical devices that generate heat when they operate, e.g. hybrid lasers or amplifiers, the thermal resistance between the heat source and heat sink is a key device parameter as it dictates the actual working temperature of the active area of the device. Typically for devices built on SOI the heat sink is placed underneath the silicon substrate 104 and typically is a thermoelectric cooler (TEC) device (not shown). For small waveguides (<1.5 µm) that use this thermal architecture, the $SiO_2$ buried oxide layer is the dominant source of thermal resistance (compare the thermal conductivity of $SiO_2$ (1.1-1.4 W/m.K) to that of Silicon (130 W/m.K)).

FIG. 2A shows a typical cross-section of a hybrid laser structure. As above, it may include an SOI structure comprising a silicon epitaxial layer that as a waveguide 200, with the $SiO_2$ buried oxide layer 202 acting as a lower cladding confining the optical mode and stopping it leaking into the lower silicon substrate 204. The laser may comprise a InP p-cladding 208, an active region 210, an InP—H+ implant region 212 over a InGaAsP n-contact layer 214 and an Au contact 216.

FIG. 2B shows a simulation of the temperature profile in this same device when 1.5 W of electrical power is dissipated. Current in the device flows from the p-contact, through the p-InP cladding layer 208 to the active region 210, then through the n-contact layer 210 to the n-metal. As can be seen in FIG. 2B significant device heating occurs in the active region of the laser. This leads to degraded device performance, such as reduced output power and increased threshold currents. The thermal impedance of this device is about 44.3 0C/W

BRIEF DESCRIPTION OF THE DRAWINGS

The foregoing and a better understanding of the present invention may become apparent from the following detailed description of arrangements and example embodiments and the claims when read in connection with the accompanying drawings, all forming a part of the disclosure of this invention. While the foregoing and following written and illustrated disclosure focuses on disclosing arrangements and example embodiments of the invention, it should be clearly understood that the same is by way of illustration and example only and the invention is not limited thereto.

DETAILED DESCRIPTION

Described is a thermal shunt compatible with SOI devices, including hybrid silicon lasers, which allows the thermal resistance of the laser structure to be reduced from about 44 C/W (current value without thermal shunt) to as low as about 18.6 C/W. Reducing the devices' thermal resistance is desirable for obtaining both high optical output power and high temperature laser sources on silicon.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 1:
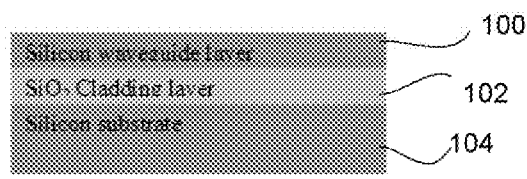
FIG. 1 is a diagram of a simple silicon on insulator (SOI) wafer.
Figure 2A:
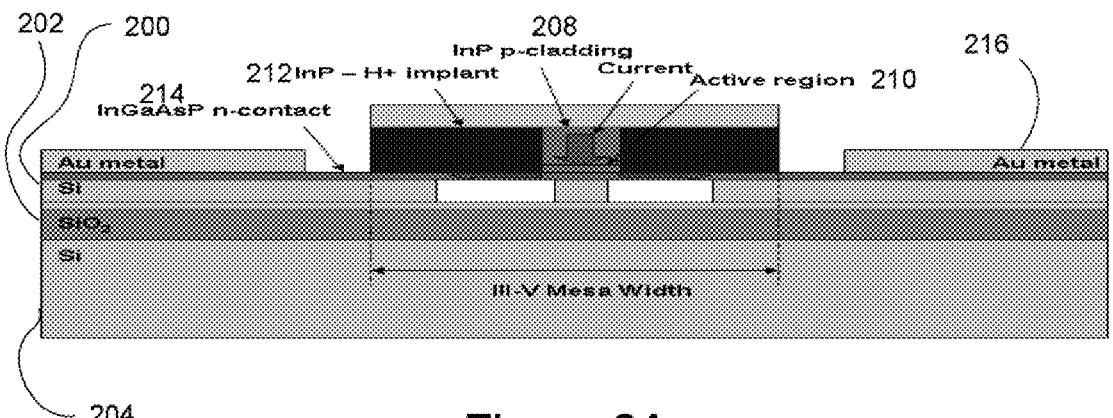
FIG. 2A is a diagram of a cross-section of a hybrid laser on an SOI wafer.
Figure 2B:
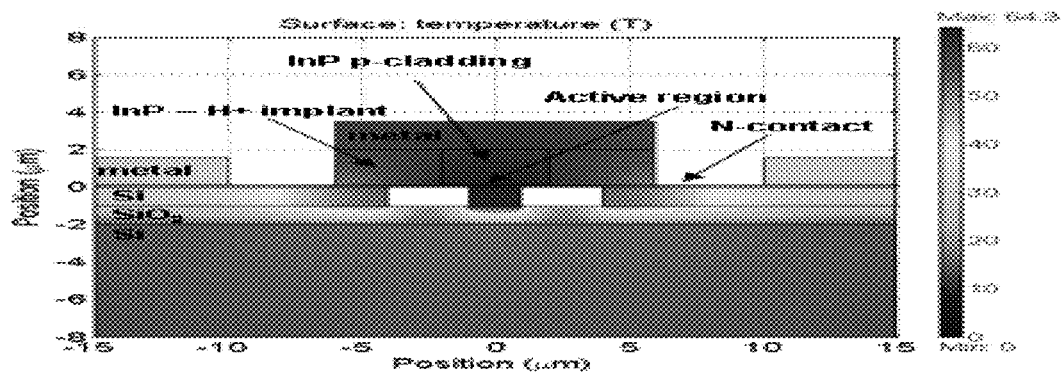
FIG. 2B shows a simulation of the temperature profile of the device shown in FIG. 2A when about 1.5 W of electrical power is dissipated.
Figure 3A:
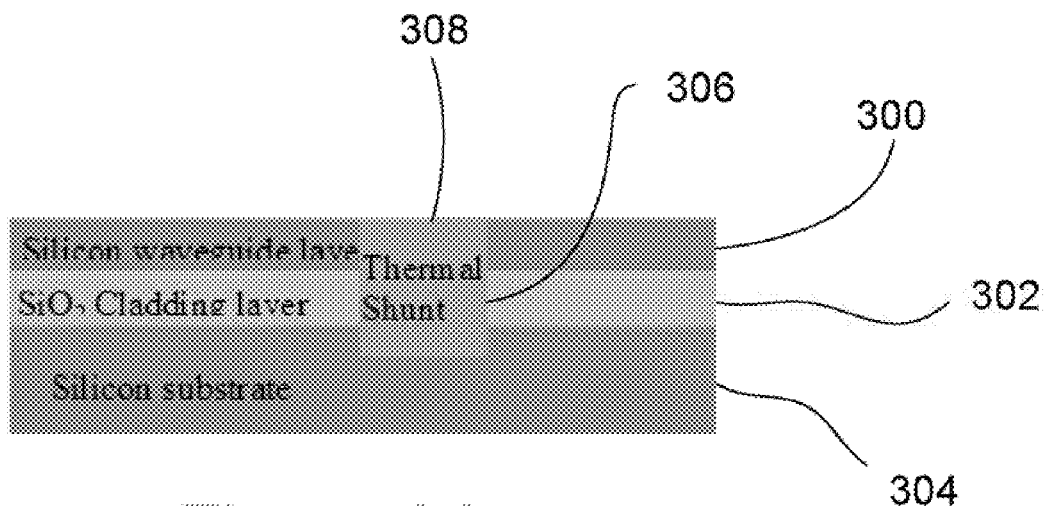
FIGS. 3A and 3B are a cross sectional side view and a top view, respectively, of an SOI wafer having a thermal shunt according to one embodiment of the invention.
Figure 3B:
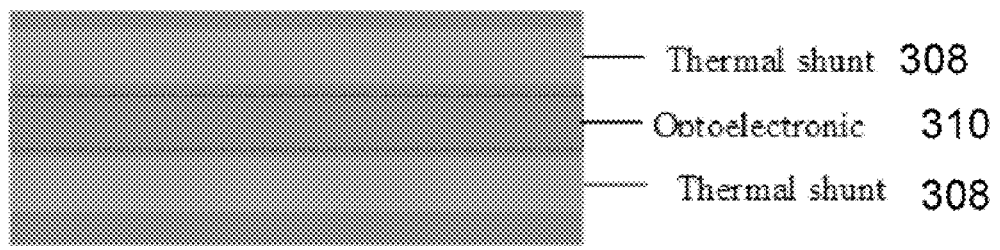

FIGS. 3A and 3B shows a simplified view side view and top view, respectively, of an SOI wafer according to one embodiment of the invention. The wafer may include an $SiO_2$ structure comprising a silicon epitaxial layer that as a waveguide 300, with the $SiO_2$ buried oxide layer 302 acting as a lower cladding confining the optical mode and stopping it leaking into the lower silicon substrate 304. In addition, a via 306 may be etched through the buried oxide layer 302 to the silicon substrate 304 adjacent to the waveguide 300 and filling it with a high thermal conductance material to provide a thermal shunt 308 reduce the thermal resistance of an optoelectronic the device 310.

Examples of materials that can be used to provide this thermal shunt 308 are poly, amorphous or crystalline silicon, almost any metal, for example, aluminum, copper or other high thermal conductivity materials.

Figure 4A:
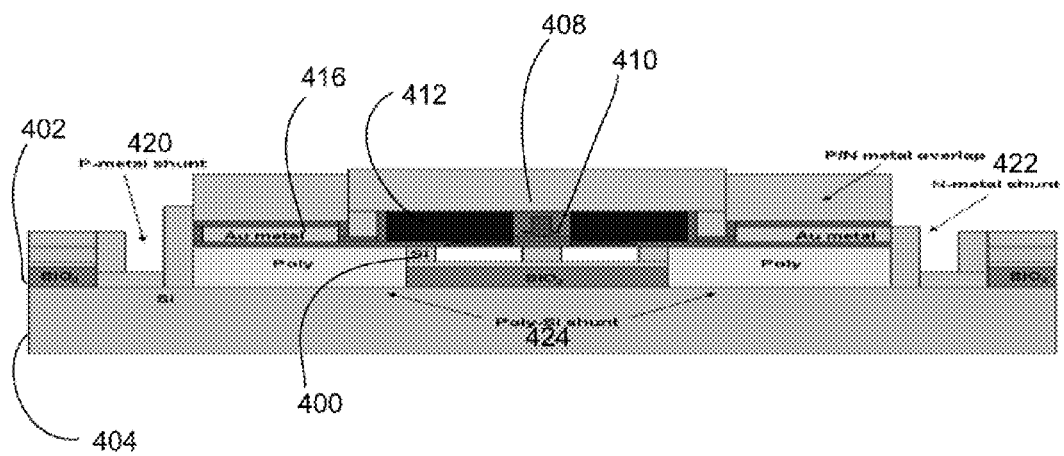
FIG. 4A is a diagram of a cross-section of a hybrid laser on an SOI wafer including thermal shunts according to one embodiment of the invention.

FIG. 4A shows a cross-section of a hybrid laser structure with thermal shunts according to one embodiment of the invention. It may include an SOI structure comprising a silicon epitaxial layer that as a waveguide 400, with the $SiO_2$ buried oxide layer 402 acting as a lower cladding confining the optical mode and stopping it leaking into the lower silicon substrate 404. The laser may comprise a InP p-cladding 408, an active region 410, an InP—H+ implant region 412 and an Au contact 416.

The structure further may include two types of thermal shunts. The first thermal shunt employed involves using p-metal contact layer 420 and n-metal contact layer 422 to conduct heat away from the active region 410 and into the silicon substrate 404.

The second type of thermal shunt involves etching a via and backfilling a portion of the silicon wafer with a heat conductive material. Here poly-silicon has been used for the backfill material to form a poly-Si thermal shunt 424. As noted above examples of materials that can be used to provide this thermal shunt 424 may include poly, amorphous or crystalline silicon, almost any metal, for example, aluminum, copper or other high thermal conductivity materials.

Figure 4B:
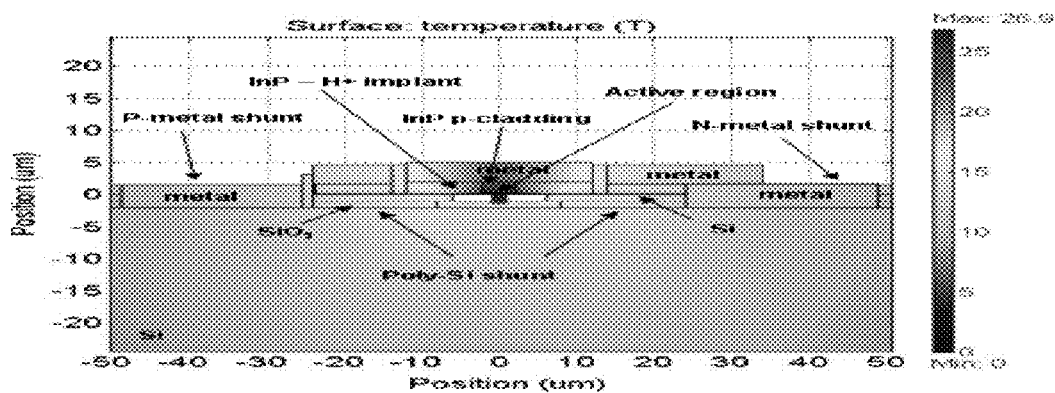
FIG. 4B shows a simulation of the temperature profile of the device shown in FIG. 4A when about 1.5 W of electrical power is dissipated

FIG. 4B shows the resultant temperature distribution with both of these types of thermal shunts included in the device. The combination of both the Poly-Si shunt 423 and p/n metal shunts, 420 and 422 reduces the operating temperature of the laser for 1.45 W of dissipated electrical power by greater than a factor of two. The maximum temperature rise in the structure is now about 26.9 degrees C. which gives a thermal impedance of about 18.6 0C/W.

Various electrically driven lasers and flip chipped lasers on silicon-on-insulator substrates show similar temperature related limitations. The thermal shunt described herein may lower the intrinsic thermal resistance of such devices and can be used in conjunction with other thermal management schemes.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

What is claimed is:

1. An apparatus, comprising:
   a silicon epitaxial layer to serve as a waveguide;
   a $SiO_2$ buried oxide layer beneath the silicon epitaxial layer to serve as a lower cladding confining an optical mode to the waveguide;
   a lower silicon substrate beneath the SiO2 buried oxide layer;
   a via traversing the $SiO_2$ buried oxide layer and into the lower silicon substrate;
   a heat conductive material filling the via to form a thermal shunt.

2. The apparatus as recited in claim 1 wherein the heat conductive material comprises one of poly-silicon, amorphous silicon or crystalline silicon.

3. The apparatus as recited in claim 1 wherein the heat conductive material comprises a metal.

4. The apparatus as recited in claim 3 wherein the metal comprises one of aluminum or copper.

5. The apparatus as recited in claim 1 further comprising:
   a hybrid laser formed over the silicon substrate in thermal contact with the thermal shunt.

6. The apparatus as recited in claim 5 further comprising:
   a P-metal layer on one side of the hybrid laser, and
   an N-metal layer on another side of the hybrid lasers wherein the P-metal layer and the N-metal layer comprise thermal shunts that conduct heat to the lower silicon substrate.

7. A method, comprising:
   providing a silicon epitaxial layer that serves as a waveguide;
   providing a $SiO_2$ buried oxide layer beneath the silicon epitaxial layer serving as a lower cladding to confine an optical mode to the waveguide;
   providing a lower silicon substrate beneath the $SiO_2$ buried oxide layer;
   etching a via through the $SiO_2$ buried oxide layer and into the lower silicon substrate; and
   filling the via with a heat conductive material to form a thermal shunt.

8. The method as recited in claim 7, wherein the heat conductive material comprises one of poly-silicon, amorphous silicon or crystalline silicon.

9. The method as recited in claim 7 wherein the heat conductive material comprises a metal.

10. The method as recited in claim 9 wherein the metal comprises one of aluminum or copper.

11. The method as recited in claim 7, further comprising:
    forming a hybrid laser over the silicon substrate in thermal contact with the thermal shunt.

12. The apparatus as recited in claim 11 further comprising:
    patterning a P-metal layer on one side of the hybrid laser; and
    patterning an N-metal layer on another side of the hybrid laser, wherein the P-metal layer and the N-metal layer comprise thermal shunts that conduct heat to the lower silicon substrate.

13. A hybrid laser formed on a silicon on insulator (SOI) wafer comprising:
    a silicon epitaxial layer to serve as a waveguide;
    a SiO2 buried oxide layer beneath the silicon epitaxial layer to serve as a lower cladding confining an optical mode to the waveguide;
    a lower silicon substrate beneath the SiO2 buried oxide layer;
    a InGaAsP layer formed over the silicon epitaxial layer;
    an InP—H+ implant layer adjacent the InGaAsP layer;
    a InP p-cladding layer adjacent the InP—H+ implant layer and adjacent to an active region; and
    at least one thermal shunt to conduct heat through the $SiO_2$ buried oxide layer to the lower silicon substrate.

14. The hybrid laser as recited in claim 13 wherein the at least one thermal shunt comprises:
    a via etched through the $SiO_2$ buried oxide layer and into the lower silicon substrate; and
    a heat conductive material filling the via.

15. The hybrid laser as recited in claim 14 wherein the heat conductive material comprises one of poly-silicon, amorphous silicon or crystalline silicon.

16. The hybrid laser as recited in claim 14 wherein the heat conductive material comprises a metal.

17. The hybrid laser as recited in claim 16 wherein the metal comprises one of aluminum or copper.

18. The hybrid laser as recited in claim 13, wherein the at least one thermal shunt comprises:
    a P-metal layer on one side of the hybrid laser; and
    an N-metal layer on another side of the hybrid laser, wherein the P-metal layer and the N-metal layer com prise thermal shunts that conduct heat to the lower silicon substrate.

19. The hybrid laser as recited in claim 13, wherein the at least one thermal shunt comprises:
- a first thermal shunt comprising a via etched through the SiO$_2$ buried oxide layer and into the lower silicon substrate filled with a heat conductive material; and
- a second thermal shunt comprising a P-metal layer on one side of the hybrid laser and an N-metal layer on another side of the hybrid laser both the P-metal layer and the N-metal layer in contact with the tower silicon substrate.

* * * * *